United States Patent
Long

(10) Patent No.: US 7,455,554 B2
(45) Date of Patent: Nov. 25, 2008

(54) EMI SHROUD WITH BIDIRECTIONAL CONTACT MEMBERS

(75) Inventor: Jerry Long, Elgin, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/645,895

(22) Filed: Dec. 27, 2006

(65) Prior Publication Data

US 2007/0212942 A1 Sep. 13, 2007

Related U.S. Application Data

(60) Provisional application No. 60/754,459, filed on Dec. 28, 2005.

(51) Int. Cl.
*H01R 13/648* (2006.01)

(52) U.S. Cl. .................... 439/609; 439/927

(58) Field of Classification Search .......... 439/92, 439/95, 939, 607, 609, 927; 361/751, 752, 361/756; 385/88, 89, 92
See application file for complete search history.

(56) References Cited

U.S. PATENT DOCUMENTS

| | | | | |
|---|---|---|---|---|
| 4,550,960 A | * | 11/1985 | Asick et al. | 439/61 |
| 5,317,105 A | * | 5/1994 | Weber | 174/355 |
| 5,354,951 A | | 10/1994 | Lange et al. | |
| 5,959,244 A | * | 9/1999 | Mayer | 174/369 |
| 6,139,367 A | | 10/2000 | Yeh | |
| 6,416,361 B1 | * | 7/2002 | Hwang | 439/607 |
| 6,478,622 B1 | * | 11/2002 | Hwang | 439/607 |
| 6,612,868 B2 | | 9/2003 | Hwang | |
| 6,649,827 B2 | | 11/2003 | West et al. | |
| 6,654,256 B2 | | 11/2003 | Gough | |
| 6,897,371 B1 | | 5/2005 | Kurz et al. | |
| 2003/0169581 A1 | | 9/2003 | Bright et al. | |
| 2005/0037655 A1 | | 2/2005 | Henry et al. | |
| 2007/0128936 A1 | | 6/2007 | Long et al. | |
| 2007/0128937 A1 | | 6/2007 | Long et al. | |
| 2007/0212942 A1 | * | 9/2007 | Long | 439/608 |

FOREIGN PATENT DOCUMENTS

| | | |
|---|---|---|
| EP | 0 963 145 | 12/1999 |
| EP | 1 026 785 | 8/2000 |
| EP | 1 349 441 | 10/2003 |
| WO | WO 97/30491 | 8/1997 |
| WO | WO 98/02940 | 1/1998 |

OTHER PUBLICATIONS

International Search Report of International Patent Application No. PCT/US2006/049362, Nov. 5, 2007.

* cited by examiner

*Primary Examiner*—James Harvey
(74) *Attorney, Agent, or Firm*—Thomas D. Paulius

(57) ABSTRACT

An EMI gasket takes the form of a formed conductive shroud that completely encircles a metal shielding cage. The shroud has an opening that is surrounded by a plurality of sides and the shroud contains a base portion that has slits formed in a leading edge thereof. The slits define a plurality of spring arms or contacts that are bent in opposing directions so that some of the spring arms extend up and out into contact with a faceplate inserted over the shielding cage and the remaining spring arms extend down and into the shielding cage interior to contact a module inserted therein.

13 Claims, 8 Drawing Sheets

EMI SHROUD WITH BIDIRECTIONAL CONTACT MEMBERS

This application claims priority from prior U.S. Provisional Patent Application No. 60/754,459, filed Dec. 28, 2005.

BACKGROUND OF THE INVENTION

The present invention relates generally to structures that prevent or retard electromagnetic interference ("EMI") emissions from connector assemblies, and more particularly to an EMI shroud intended for use on a metal shielding cage for blocking electromagnetic interference emissions.

It is a common practice in the electronic arts to connect cables to a circuit board by utilizing plug connectors at the ends of the cables which are intended for insertion into an opposing mating connector. The mating connector is typically mounted on a circuit board, which is held within an exterior housing. Such an arrangement is typically found in servers and routers. These devices have multiple connector assemblies that now operate at high speeds, typically 2 gigabits per second and greater. The high speed electrical transmission in these devices can produce electromagnetic emissions, which may leak from the connection between the plug connector and its mating connector, mounted within a device, such as a router or server. These emissions can cause problems in high speed transmissions in that they can negatively influence signal transmissions between the connectors.

These types of transmissions are routinely reduced by the use of a metal shielding cage that is also mounted to the circuit board and which surrounds the mating connector in the device. These cages have openings that open to a faceplate, which is commonly referred to as a bezel in the art. These openings define an entrance leading toward the mating connector into which the plug connector is inserted. Testing has determined that despite the metal shielding cages, EMI leakage still occurs in such structure, primarily at the areas where the shielding cages meet the circuit board and around the opening(s) of the faceplate or bezel, into which the cage openings extend. Conductive gaskets have been developed to address this problem.

Problems still exist in the use of gaskets, for it is desired that the gaskets be conductive and held in close contact to both the shielding cages and the faceplate. These cages are becoming smaller and smaller in size as the overall size of most electronic devices continues to diminish. The small size of the cages often makes it difficult to develop a structure that will force the EMI gasket into reliable contact with the faceplate and the cage, without detrimentally affecting the strength of the shielding cage. Additionally, the shielding cage must be provided with spring-like contacts that engage both the module inserted into the cage and the surrounding bezel. Such a structure is difficult to from at the front edge of the shielding cage.

Accordingly, the present invention is directed to an improved EMI gasket structure that takes the form of a shroud and which overcomes the disadvantages of the prior art.

SUMMARY OF THE INVENTION

Accordingly, it is a general object of the present invention to provide an EMI gasket structure for use with a shielding cage that utilizes a conductive shroud which includes a plurality of spring contacts formed therewith that extend in two different directions so as to contact both a bezel that extends around a shielding cage and a module inserted into the shielding cage.

Another object of the present invention is to provide an EMI gasket assembly in the form of a conductive shroud that encircles the opening of a metal shielding cage, the shroud closely fitting against the cage and an interior surface of a faceplate installed over the cage opening, the assembly including means for conducively contact both a bezel inserted over the shielding cage and a module inserted into the shielding cage.

Yet a further object of the present invention is to provide an EMI shroud for a shielding cage, the shroud having a continuous perimeter with an inner opening that receives the front end of a metal shielding cage therein, the shroud being from a conductive material and having a plurality of first spring contacts formed therewith and extending in a first direction along a front edge of the shroud, and a plurality of second spring contacts formed therewith and extending in a second direction, different than the first direction, along the front edge of the shroud.

A still further object of the present invention is to provide an EMI gasket for a metal shielding cage, the shielding cage having a generally rectangular front end that fits into an opening of a faceplate of an electronic device, the front end including a plurality of grounding spring arms formed therewith at preselected locations on the perimeter of the shielding cage front end, the gasket including a conductive shroud that encircles the cage front end, the shroud including a plurality of spring contacts for contacting the faceplate and an electronic module inserted into the shielding cage.

Yet another object of the present invention is to provide an EMI gasket for a metal shielding cage, the shielding cage having a generally rectangular front end that fits into an opening of a faceplate of an electronic device, the front end including a plurality of grounding spring arms formed therewith at preselected locations on the perimeter of the shielding cage front end, the gasket including a conductive shroud that encircles the cage front end, the shroud including a plurality of slots, each slot receiving one of the shielding cage grounding spring arms therein, the gasket further including a plurality of first and second spring arms, the first spring arms extending outwardly with respect to the shielding cage and the second spring arms extending inwardly with respect to the shielding cage, the second spring arms extending into the interior of the shielding cage into contact with a module inserted therein.

Yet still another object of the present invention is to provide a shielding cage and an EMI gasket for fitting around the front edge of the shielding cage, the EMI gasket having a plurality of first and second spring contacts formed therewith, the first spring contacts extending outwardly from the gasket in order to contact an exterior bezel or faceplate placed over the shielding cage, and the first spring contacts filling in the area between adjacent shielding cage spring contacts, the second spring contacts extending inwardly from the gasket and fitting through slots formed in the shielding cage so as to extend into an interior of the shielding cage to contact a module inserted thereinto.

The present invention accomplishes these and other objects and aspects by virtue of its structure, which in one principle aspect includes a conductive shroud that has a generally rectangular shape, so that it extends around the perimeter of the front end of the shielding cage. Preferably, the shroud is formed from a single piece of conductive material, such as a metal coated plastic or a spring steel or the like, and it is formed with a central opening so that it extends in a continuous fashion around the entire perimeter of the shielding cage front end.

The shroud, as exemplified by the preferred embodiment of the invention, may be formed with a plurality of slits in spaced apart fashion along its front edge. These slits serve to define a plurality of contacts in the form of spring arms. The spring arms are formed in two distinct sets of first and second spring arms. The first spring arms generally have a larger width than the second spring arms and the first and second spring arms are formed so that they extend in different directions.

The first spring arms are formed as part of the gasket so that they extend (or are deflected) upwardly from a base of the gasket. In this manner, they provide contact points to anything placed over the shielding cage, typically a faceplate or bezel. The second spring arms are also formed as part of the gasket so that they extend downwardly with respect to the gasket base. In this manner, they can be inserted into openings formed in the shielding cage so that the second spring arms extend into the shielding cage so as to contact any device inserted therein and the first spring arms contact the outer faceplate.

In another aspect of the present invention, the shielding cage has a plurality of slots formed therewith and these slots provide points of entrance, or openings, in the shielding cage through which the second spring arms extend. The slots are formed coincident with the spring contact tabs that are formed as part of the shielding cage and the gasket second spring arms extend beneath these shielding cage contact tabs.

These and other objects, features and advantages of the present invention will be clearly understood through a consideration of the following detailed description.

BRIEF DESCRIPTION OF THE DRAWINGS

The invention, together with its objects and the advantage thereof, may be best understood by reference to the following description taken in conjunction with the accompanying drawings, in which like reference numerals identify like elements in the figures and in which.

DETAILED DESCRIPTION OF THE PREFERRED EMBODIMENTS

Figure 1:
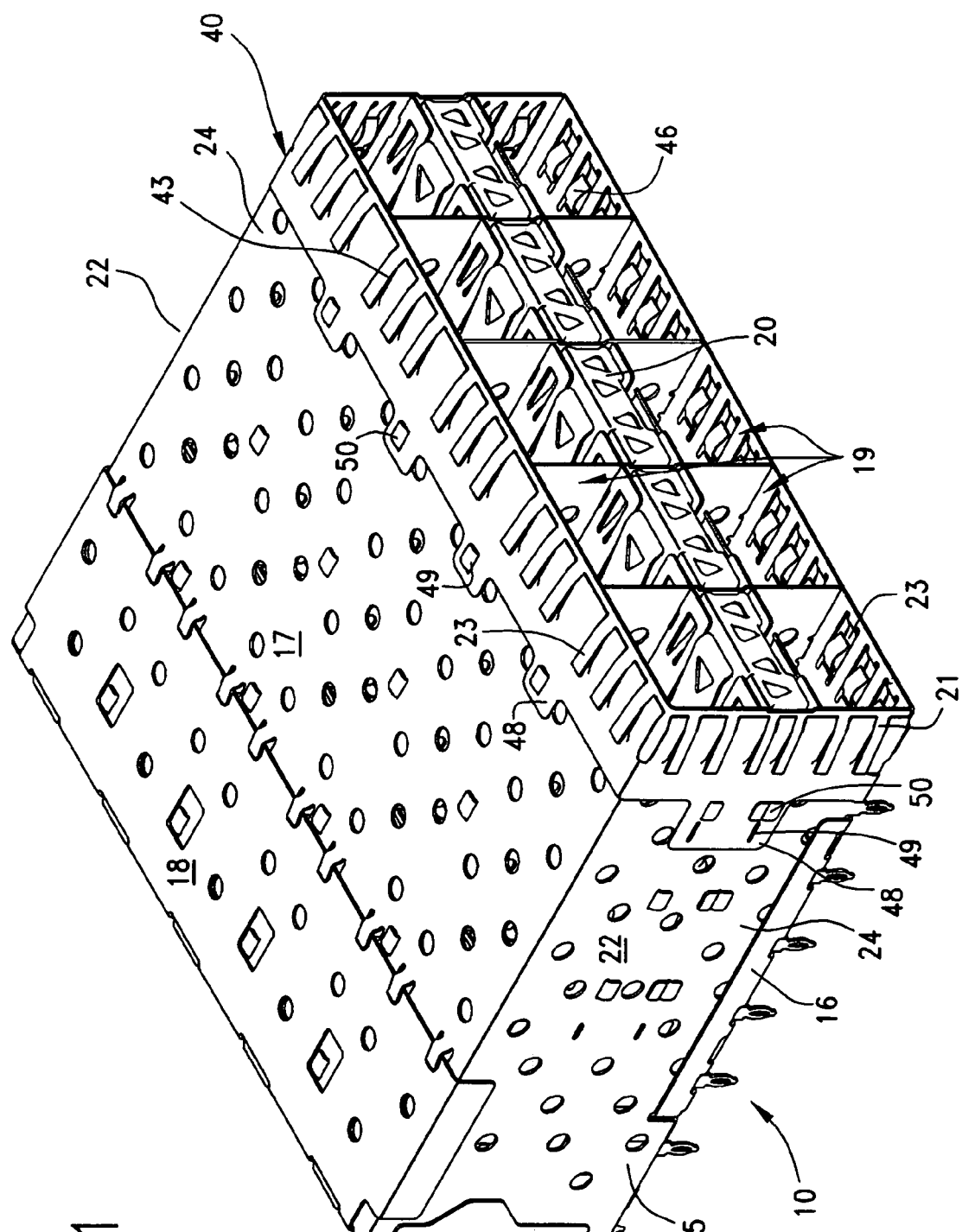
FIG. 1 is a perspective view of an assembly in the form of a shielding cage and an EMI gasket constructed in accordance with the principles of the present invention, which is fitted to the front end of the shielding cage.
Figure 2:
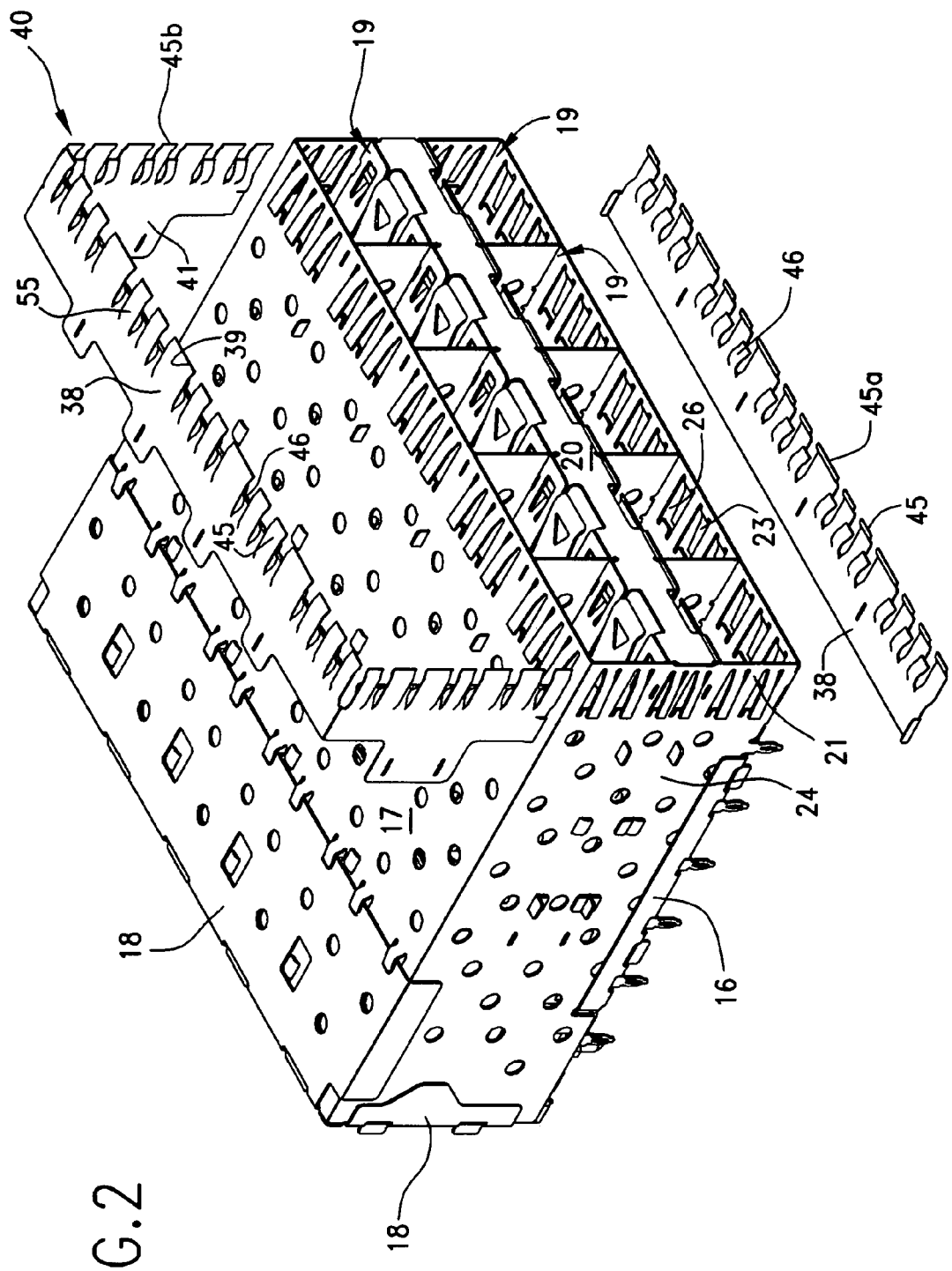
FIG. 2 is the same view as FIG. 1, but illustrated in an exploded fashion with the EMI gasket removed from the shielding cage front end.
Figure 3:
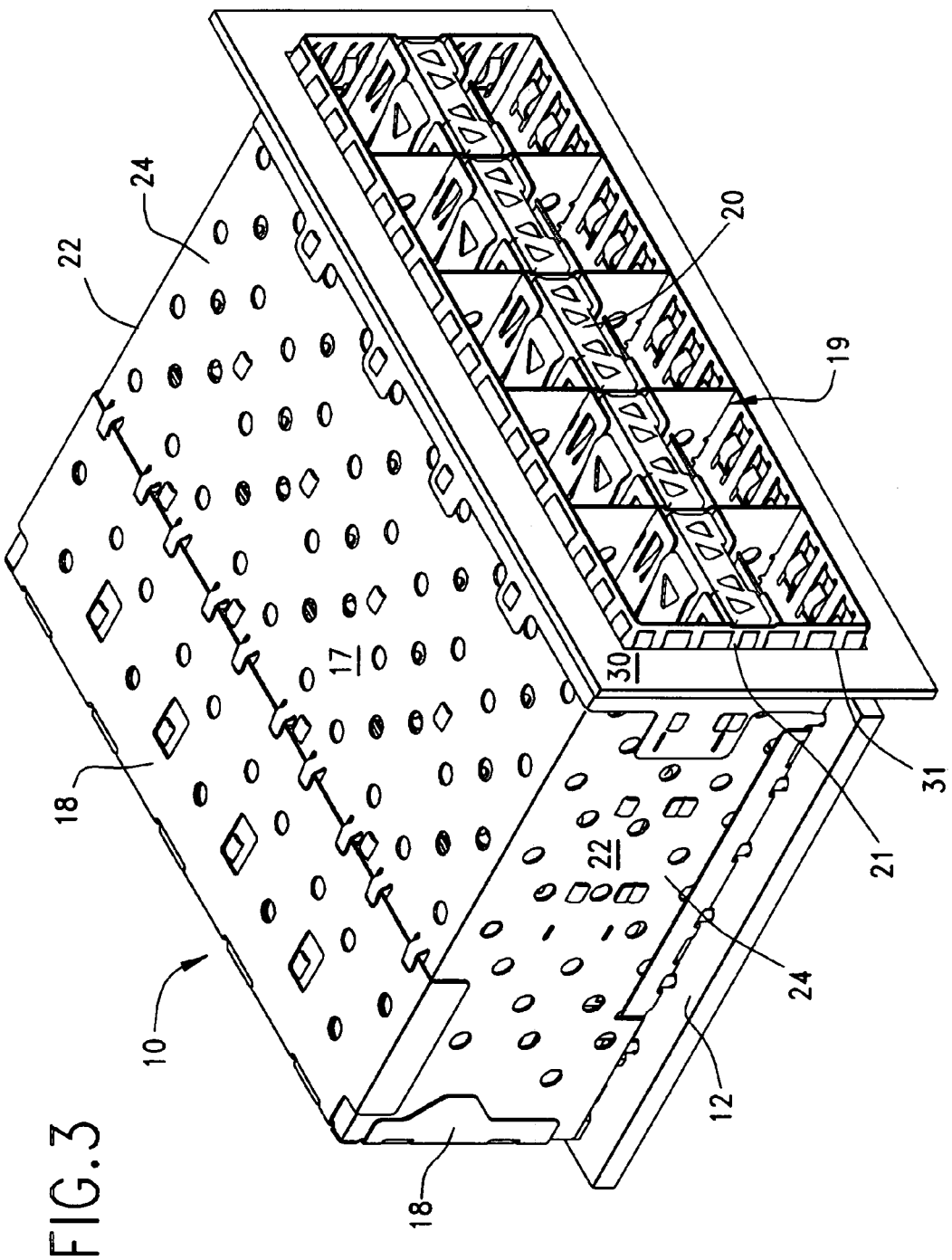
FIG. 3 is the same view as FIG. 1, but with the shielding cage mounted to a circuit board and with a faceplate, or bezel, attached tot he front end of the shielding cage.

FIG. 1 illustrates an electronic assembly 10 of the type that would normally be found in a router or server and which is utilized in the transmission of high speed data signals. Such an assembly includes a plurality of receptacle-style connectors held within each of the openings of the shielding cages and that are mounted in a stacked configuration, to a circuit board 12. (FIG. 3.) A metal shielding cage 15 is provided and as, shown the cage 15 includes a base plate, or bottom wall 16, a body portion 17 (which includes a pair of spaced apart sidewalls 22) and a rear and top plate, or wall, 18 that engages the cage and covers its rear end and part of its top. The cage 15 has a series of openings 9 that lead to respective hollow interior bays, into each of which an electronic module (also not shown) attached to a cable end, may be inserted. Once assembled, the shielding cage 15 has a plurality of exterior surfaces 24. The metal shielding cage 15 is conductive and the front end of it is usually inserted into a faceplate 30 of an electronic device. Specifically, the front end 21 of the shielding cage assembly is received within an opening 31 of the faceplate 30. The faceplate opening 31 has an interior perimeter, or lip 32.

FIG. 1 shows the assembly as including a shielding cage 15 of the 2×5 style, that is two horizontal rows with five cage openings 19 each extending in a horizontal fashion. The openings 19 are stacked one on top of each another and in order to accommodate this arrangement, the shielding cage 15 illustrated includes an interior, or center, wall portion 20 which separates the two bays or openings from each other. Electronic modules, which are connected to wire cables, are inserted into and removed from in order to make a connection to the receptacle connectors held in the interior of the shielding cage 15.

Figure 4:
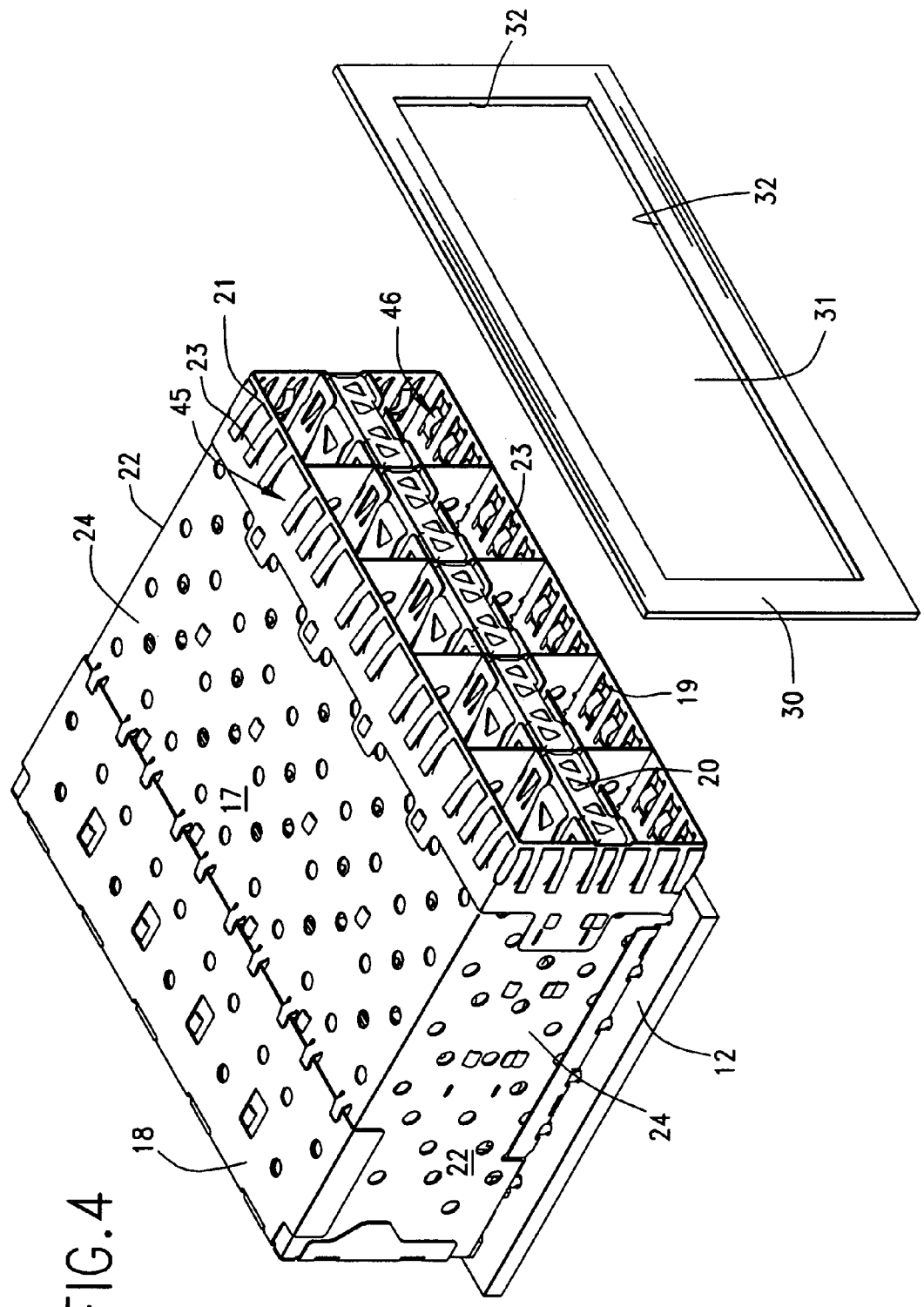
FIG. 4 is the same view as FIG. 3, but with the faceplate shown exploded away from the shielding cage.

The shielding cage 15 and its internal connectors and supporting circuit board are held together in a exterior enclosure (not shown) but which includes a faceplate, or bezel 30. (FIGS. 3 & 4.) This faceplate 30 sits over the front of the exterior enclosure and around the perimeter of the shielding cage as shown. In this regard, the faceplate 30 is typically a continuous member, formed from sheet metal with a desired thickness, and an inner opening 31. A lip 32 defines the inner surface of the faceplate opening 31. When assembled, and as shown best in FIG. 3, the front end 21 of the shielding cage projects slightly past the outer surface 31 of the faceplate 30. The fit between the shielding cage 15 and the faceplate lip 33 is preferably an interference fit, but with the faceplate loose enough to be slid over the cage front end 21.

The area between the faceplate and the shielding cage is prone to the discharge, or leakage, of electromagnetic emissions during high speed data transfer that can cause EMI. Accordingly, designers in the electronic arts endeavor to provide some sort of gasket that fits between the shielding cage and the faceplate. The present invention is directed to such a gasket. Problems arise in the use of such EMI gaskets because it is desirable to hold the gasket in contact between the cage and the faceplate. Conductive pliable foams have been used, but they are prone to tearing and other damage and the degree of EMI protection may be dependent on the amount of conductive material. Also, it is believed to be quite difficult to utilize a gasket to make electrical contact with all three elements of the assembly, namely, the shielding cage 15, the faceplate 30 and the module inserted-into the interior portion of the shielding cage 15.

Figure 5:
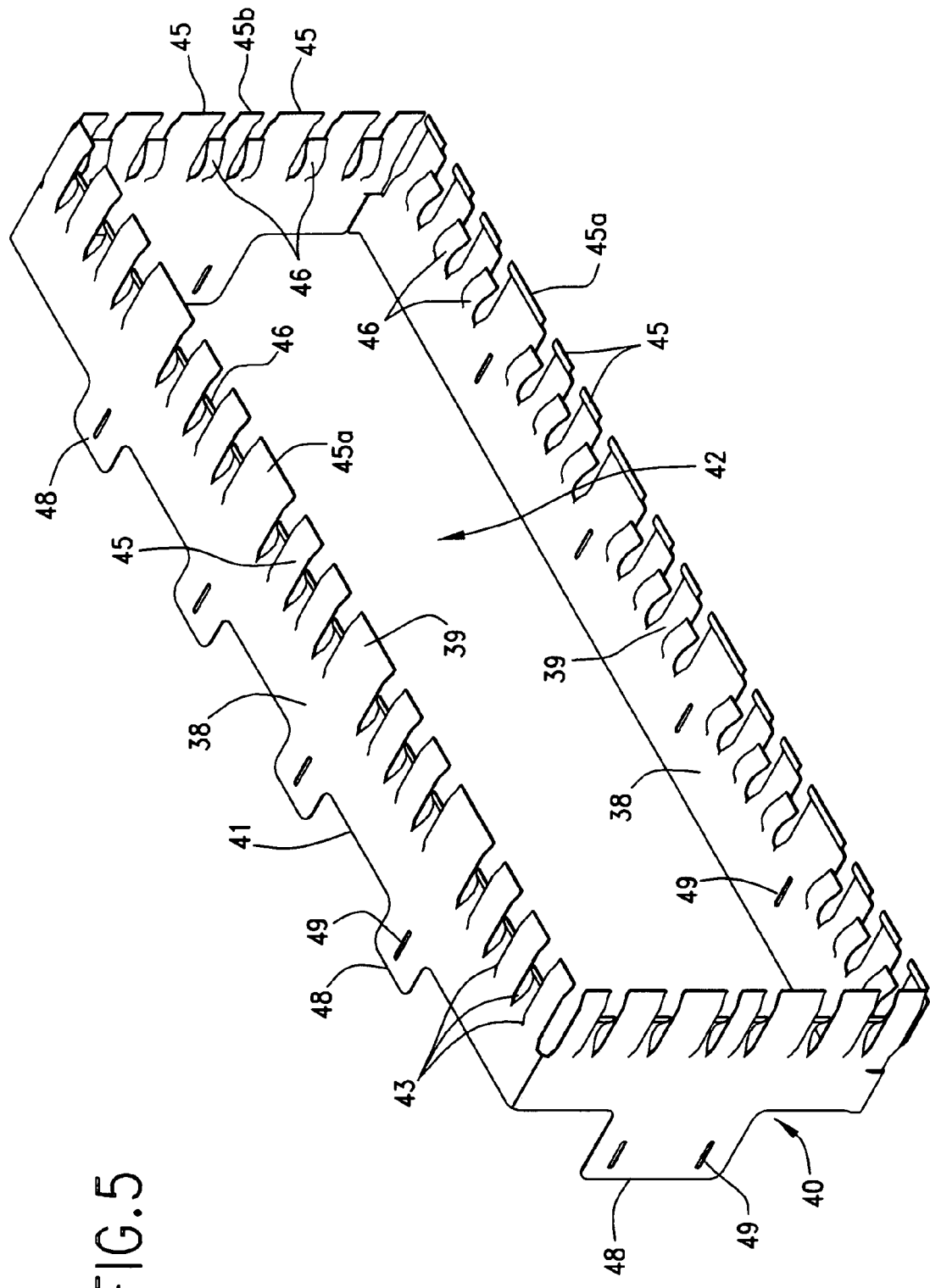
FIG. 5 is a perspective view of the gasket of FIG. 1.

The present invention utilizes an improved gasket construction. As shown in FIG. 5 a conductive gasket 40 is provided in the form of a conductive shroud 41. The shroud 41 includes a plurality of sides, which are preferably interconnected together to form a continuous structure. The shroud 41 has a central opening 42 formed therein that is sized to receive the front end 21 of the shielding cage therein. The shroud 41, in the embodiment shown, and particularly as illustrated in FIG. 5, is formed from a conductive metal such as stainless steel and it will be understood that it may also be formed from a plastic or other resilient material, and coated with a conductive plating on its exterior surfaces. Another material may be a plastic with a conductive material impregnated therewith.

The shroud 41 includes a base portion 38 and a leading edge portion 39, the leading edge portion 39 can be seen to include a plurality of slits, or cuts, 43 that are formed therein and which extend lengthwise rearwardly toward the base portion 38. The slits 43 are spaced apart from each other widthwise along the gasket 40 and serve to define a plurality of spring arms, or contacts 45, 46 along the leading edge 39 of the shroud 41. As illustrated, these slits 43 are spaced in a non-uniform spacing so as to further defines distinct first and second spring contacts 45, 46 along the leading edge.

Figure 6:
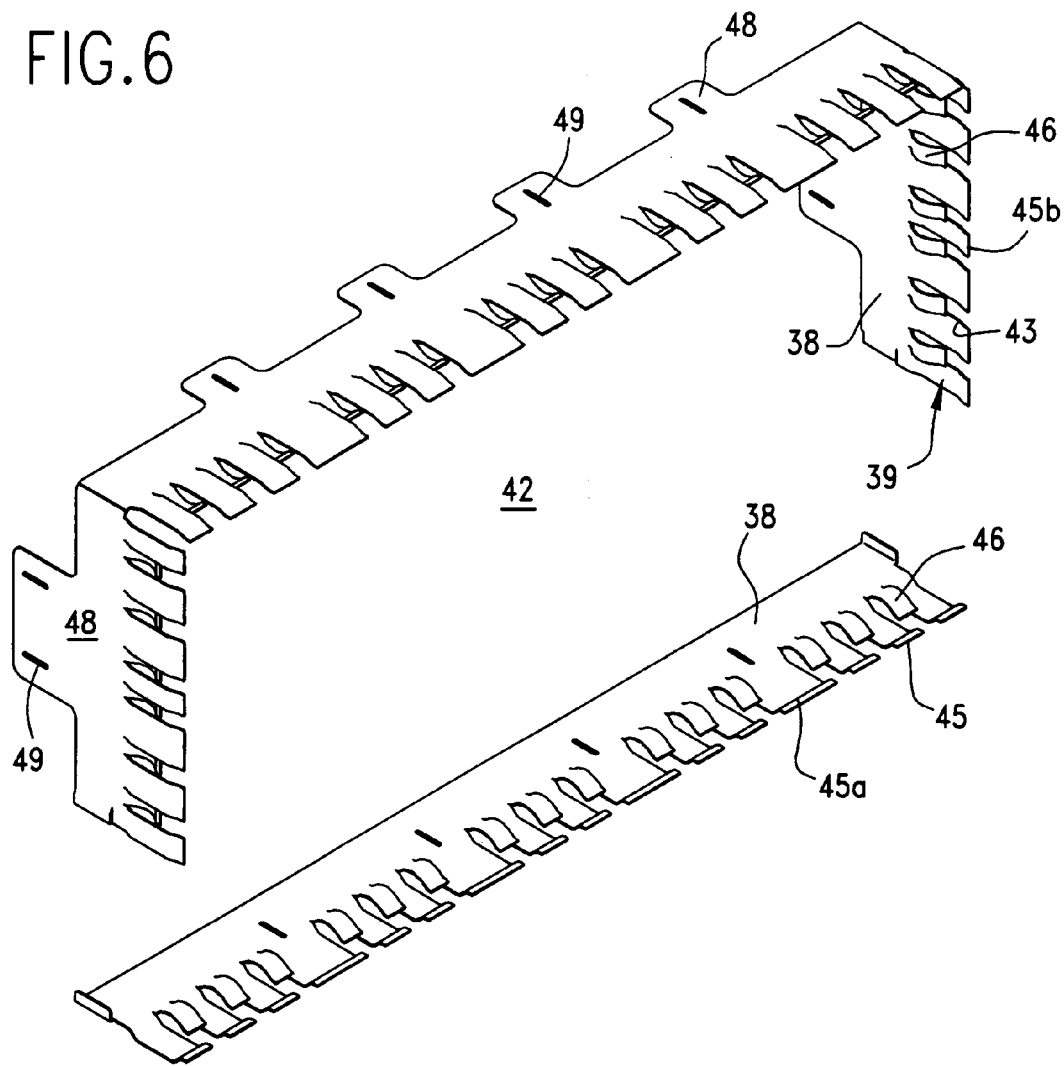
FIG. 6 is the same view as FIG. 5, but with the gasket exploded to show its two parts.

The base portions 38 of the shroud 41 may include engagement portions 48 that extend further rearwardly and which may include openings 49 that receive engagement tabs 50 that extend out from the shielding cage 15. (FIG. 1.) This structure provides points of electrical engagement between the shroud 41 and the shielding cage 15 and also sets the portion of the shroud 41 on the shielding cage 15. As illustrated in FIG. 5, the openings 49 may be formed in the base portion 38 itself, as well as in the engagement portions 48. As shown in FIGS. 5 and 6, the shroud 41 may be formed from two pieces, or it may be a single continuous member which is stamped from sheet metal and then formed into planes that are perpendicular to its plane of stamping. Provided that electrical contact is made between the two pieces, the two-piece structure will act as a continuous electrical structure.

Figure 8:
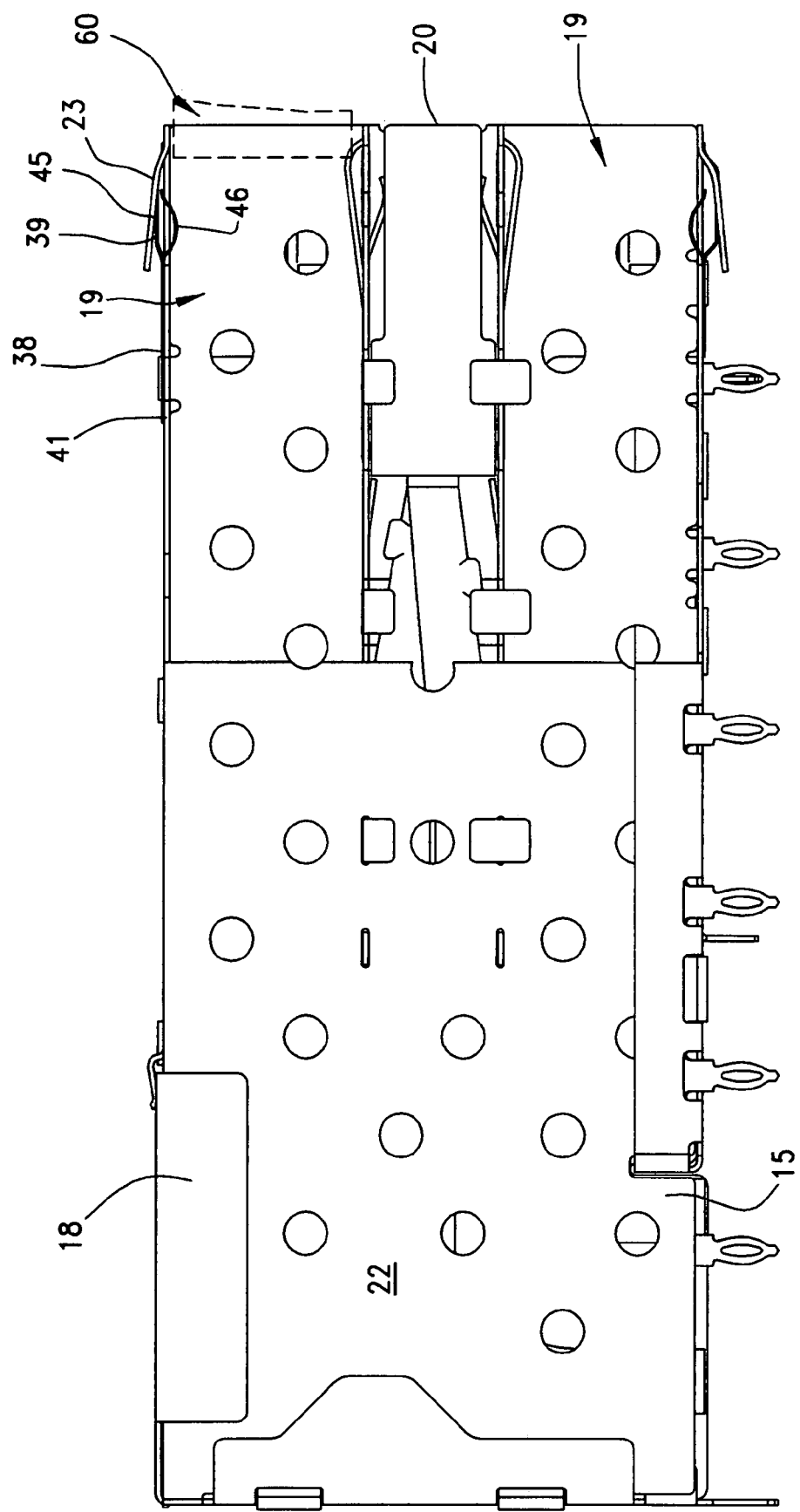
FIG. 8 is a side elevational view of the gasket and shielding cage assembly of FIG. 1, partly in section to illustrate the manner of interleaving of the gasket with the shielding cage, and to illustrate the manner of contact between an electronic module inserted into the shielding cage opening and the gaskets of the present invention; and, FIG. 9 is an enlarged detail view of a portion of FIG. 8. with a faceplate spaced apart from the front end of the shielding cage and with a module partially inserted into the shielding cage opening.

FIG. 6 illustrates the two sets of spring contacts 45, 46 that are formed along the leading edge 39 of the shroud 41. The first spring contacts can be seen to extend outwardly (and upwardly when the top part of the shroud 41 of FIG. 6 is considered) from the plane of the base portion 38. This is shown best in FIG. 8. The second spring contacts 46 can be seen to extend inwardly from the plane of the base portion 38. In this manner, the first spring contacts 45 will extend out and into contact with the interior rim 32 of the faceplate 30, while the second spring contacts 46 will extend into the interior portions of the shielding cages 15 and make contact with an electronic module inserted therein. These first spring contacts 45 are located in the areas between the contact springs 23 of the shielding cage 15 in order to close off what otherwise would be considered as open areas between the shielding cage contact springs 23 and the faceplate 30. In this manner, a consistent series of electrical contact points are maintained between the shielding cage 15, gasket 40 and the face plate 30. Thus, electrical conductivity is established between not only the faceplate and the shielding cage by way of the gasket 40, but also the inserted modules.

The first spring contacts 45 are spaced apart from each other around the shroud 41 by intervening spaces and the second spring contacts 46 are disposed in said intervening spaces. In this manner, an alternating pattern of electrical contact is also formed between the shroud 41, the module 60 and faceplate 30.

Figure 9:
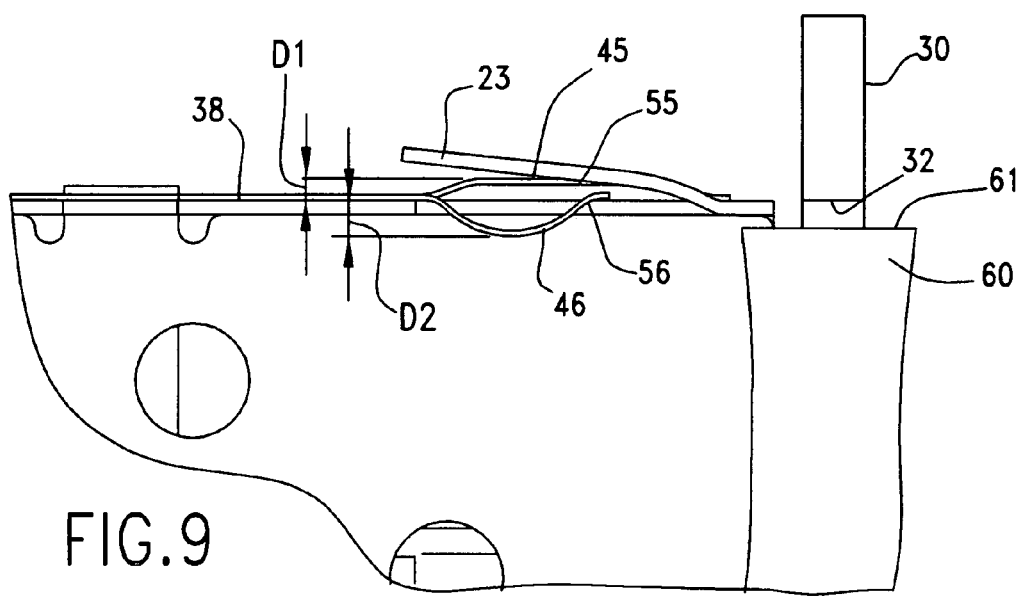
Figure 7:
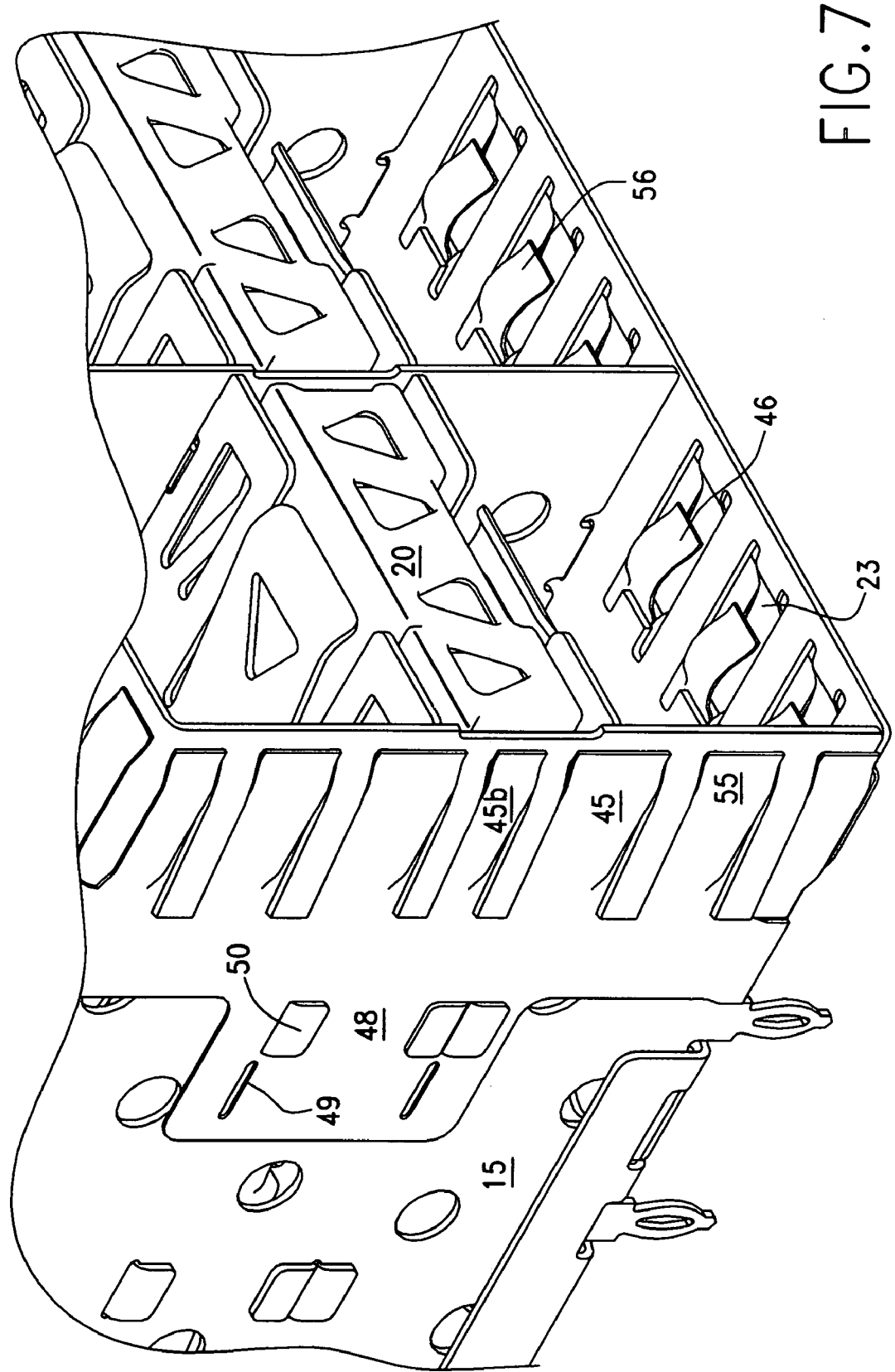
FIG. 7 is an enlarged detail view of FIG. 1, illustrating in greater detail, the interleaving of the gasket spring arms and the spring arms formed on the shielding cage.

FIG. 9 is an enlarged detail view of the gasket 40 in place on the shielding cage 15. It is a sectional view so it illustrates a first spring contact 45 extending upward from the plane (and centerline) of the shroud base portion 38, a distance Dl. Similarly, the second spring contact 46 is shown extending a distance D2 from the centerline. Both the first and second spring contacts 45, 46 are bent. The bends in the first contact springs 45 are somewhat planar, such that the free ends 55 extend almost parallel to the centerline of the base portion 38. In contrast, the second spring contacts 46 have their free ends 56 bent so that they are more arcuate, or curved, in nature. This so that when a module 60 (FIGS. 8 & 9.) is inserted into the shielding cage interior portions, they will contact the shielding cage contact springs 23, and flex, or flatten out, between the undersides of the shielding cage contact springs 23 and the exterior surfaces 61 of the module 60.

Importantly, the shielding cage contact springs 23 are formed so that they extend rearwardly from the shielding cage front end 21, and in so doing, they define a slot, or opening 26. The second contact spring contacts 46 of the shroud 41 extend into and through these openings 26. In this manner, the second spring contacts 46 of the shroud 41 are interleaved between the shielding cage spring contacts 23. The shroud first spring contacts 45 extend and lie between and in the spaces that separate the shielding cage spring contacts 23. The first spring contacts 45 on the whole tend to be wider than the second spring contacts 46 of the shroud 41. Certain ones of the first spring contacts 45, however are wider than the other first spring contacts 45. (FIG. 5.) These first spring contacts-45a lie in the areas between adjacent shielding cage bays, or where the shielding cage interior walls subdivide the assembly into the multiple bays illustrated. Likewise, some of the first spring contacts 45b have a smaller width than the regular first spring contacts 45 and this are aligned with the interior horizontal wall or spacer 20 of the shielding cage 15.

While the preferred embodiments of the invention have been shown and described, it will be apparent to those skilled in the art that changes and modifications may be made therein without departing from the spirit of the invention, the scope of which is defined by the appended claims.

The invention claimed is:

1. A shielding cage assembly for housing a connector mounted to a circuit board in an electronic device, the assembly comprising:

a metal shielding cage including at least top and bottom walls and a pair of spaced apart sidewalls that cooperate with the top and bottom walls to define an enclosure for housing the connector, the shielding cage including a front end with at least one entrance disposed thereat which leads to an interior portion of said shielding cage, the front end being insertable into an opening of a faceplate of the electronic device, said front end including a plurality of raised spring contacts formed therein that extend away from said shielding cage;

an EMI gasket, the gasket including a conductive shroud that fits around said shielding cage front end, the shroud including a central opening that receives said shielding cage front end therein, said shroud including a base portion and a leading edge portion, the leading edge portion including a plurality of spring contacts, the spring contacts being separated into distinct first and second spring contacts, the first spring contacts extending away from said shielding cage and into contact with the faceplate when said faceplate is inserted over said shielding cage front end, the second spring contacts extending into said shielding cage interior portion.

2. The shielding cage assembly of claim 1, wherein said shroud is a continuous member.

3. The shielding cage assembly of claim 1, wherein said shroud is a two-piece shroud.

4. The shielding cage of claim 1, wherein said first and second spring contacts extend in respective opposite directions.

5. The shielding cage assembly of claim 1, wherein said shroud leading edge includes a plurality of slits formed therein, the slits defining said first and second spring contacts.

6. The shielding cage assembly of claim 1, wherein said first and second spring contacts are arranged in alternating fashion along said shroud leading edge.

7. The shielding cage assembly of claim 6, wherein each of said first and second spring contact have respective widths, the widths of said first spring contacts being greater than the widths of said second spring contacts.

8. The shielding cage assembly of claim 1, wherein the shroud base portion includes openings to receive engagement tabs of said shielding cage for mounting said shroud to said shielding cage.

9. The shielding cage assembly of claim 1, wherein said first spring contacts extend outwardly with respect to said shroud base portion and away from said shielding cage, and said second spring contacts extend inwardly with respect to said shroud base portion and into said shielding cage interior portion.

10. The shielding cage assembly of claim 1, wherein said shielding cage front end includes a plurality of slots formed therein, and said shroud second spring contacts extend into said shielding cage interior portion through said slots.

11. The shielding cage assembly of claim 1, wherein said shroud is formed from a plastic and is coated with a conductive plating.

12. The shielding cage assembly of claim 1, wherein said shroud is formed from a conductive plastic.

13. An EMI shielding cage assembly for housing a connector mounted to a circuit board in an electronic device, the assembly comprising:

a metal shielding cage including top and bottom walls and a pair of spaced apart sidewalls that cooperatively define an enclosure for housing the connector, the shielding cage including a front end an entrance formed therein which leads to an interior portion of said shielding cage, the shielding cage front end being insertable into an opening of a faceplate of the electronic device, said front end including a plurality of raised spring contacts formed therein that extend away from said shielding cage;

an EMI gasket, the gasket including a conductive shroud that fits around said shielding cage front end, the shroud including a central opening that receives said shielding cage front end therein, said shroud including a base portion and a leading edge portion, the leading edge portion including a plurality of spring contacts separated into groups of distinct first and second spring contacts, the first spring contacts extending away from said shielding cage and into contact with the faceplate when said faceplate is inserted over said shielding cage front end, the second spring contacts extending into said shielding cage interior portion, each of said first and second spring contact have respective widths, and the widths of said first spring contacts being greater than the widths of said second spring contacts.

* * * * *